US007855565B2

(12) United States Patent
Liu et al.

(10) Patent No.: US 7,855,565 B2

(45) Date of Patent: Dec. 21, 2010

(54) SUBSTRATE CHARACTERIZATION DEVICE AND METHOD FOR CHARACTERIZING A SUBSTRATE

(75) Inventors: Chu-heng Liu, Penfield, NY (US); William H Wayman, Ontario, NY (US)

(73) Assignee: Xerox Corporation, Norwalk, CT (US)

( * ) Notice: Subject to any disclaimer, the term of this patent is extended or adjusted under 35 U.S.C. 154(b) by 251 days.

(21) Appl. No.: 12/266,125

(22) Filed: Nov. 6, 2008

(65) Prior Publication Data

US 2010/0109682 A1 May 6, 2010

(51) Int. Cl.
*G01R 27/26* (2006.01)

(52) U.S. Cl. ...................... 324/663; 324/671; 324/71.1; 324/452

(58) Field of Classification Search ................. 324/663, 324/671, 71.1, 452
See application file for complete search history.

(56) References Cited

U.S. PATENT DOCUMENTS 4,610,530 A 9/1986 Lehmbeck et al.
5,747,698 A 5/1998 Spillman, Jr. et al.
5,934,140 A 8/1999 Jackson et al.
6,087,837 A * 7/2000 Chase ........................ 324/693
6,384,611 B1 * 5/2002 Wallace et al. .............. 324/671
6,844,937 B2 1/2005 Dempsey et al.
7,271,593 B2 9/2007 Junginger et al.
7,433,539 B2 10/2008 Wang et al.
2005/0089200 A1 * 4/2005 Nysaether ................... 382/124
2006/0228486 A1 10/2006 Facci et al.

* cited by examiner

*Primary Examiner*—Vincent Q Nguyen
(74) *Attorney, Agent, or Firm*—Carter, DeLuca, Farrell & Schmidt, LLP

(57) ABSTRACT

A substrate characterization device is provided which includes a sensor module and a processor. The sensor module has at least one contact surface configured to contact the substrate, the sensor module configured to measure a variance of capacitance in at least two dimensions of the substrate, the sensor module further configured to generate a signal indicative of the measured variance. The processor is in operative communication with a memory module and configured to execute a series of programmable instructions for making a comparison of the signal generated by the sensor module with at least one reference signal. The processor is further configured to generate at least one characterization signal based on the comparison.

21 Claims, 5 Drawing Sheets

SUBSTRATE CHARACTERIZATION DEVICE AND METHOD FOR CHARACTERIZING A SUBSTRATE

BACKGROUND

The present disclosure relates to substrate sensing devices, and more particularly, to a device and method for characterizing a substrate.

It has been discovered that the quality of a substrate, such as paper, can vary from batch to batch, which can have a significant impact on image quality ("IQ") performance of print jobs. This variation usually occurs when paper is manufactured. Even substrates of the same type, whether they are glossy, recycled, copy, or formal substrates, may vary in quality from batch to batch. One of the types of variations in which batches may differ is their electrical properties. It is known that the electrical properties of a substrate play a major role in image quality performance, since an electric field is utilized to transfer toner to substrate. Thus, the electrical properties affect the IQ performance of a print job, which in turn, increases image mottle and/or spots, more specifically, half-tone mottle.

In the business arena, a customer usually reports a print quality problem to a service technician. The service technician then examines the configuration of a printing machine, the condition and quality of the imaging components of the printing machine, and the type and/or brand of paper being used. The service technician evaluates the problem and presents the results to the customer. It would be useful and beneficial to have a device that can characterize the quality of paper and determine whether the substrate has caused or will cause any implications to print quality and/or image quality.

SUMMARY

In an embodiment of the present disclosure, a substrate characterization device includes a sensor module and a processor. The sensor module has at least one contact surface (e.g., located at an end of a probe) configured to contact the substrate (e.g., paper). The sensor module is configured to measure a variance of capacitance in at least two dimensions of the substrate and is configured to generate a signal indicative of the measured variance.

The processor is in operative communication with a memory module and configured to execute a series of programmable instructions for making a comparison of the signal generated by the sensor module with at least one reference signal. The processor is further configured to generate at least one characterization signal based on the comparison. The at least one characterization signal is indicative of at least one characteristic (e.g., quality) of the substrate. The at least one reference signal may be stored by the memory module or may be a real-time reference signal. In addition, the at least one characteristic may be clarity, resolution, sharpness, or transparency.

In embodiments, a measuring module is in communication with the probe and configured to measure a distance along the substrate. The distance may be measured via a line-scan by moving the probe along the substrate and/or by moving the substrate along a plurality of contact surfaces.

In embodiments, the substrate characterization device is integrated within a xerographic printer and/or a handheld device.

In other embodiments, a substrate handling device includes a substrate transport mechanism, a substrate transport controller, and a substrate characterization device. The substrate transport mechanism is configured to transport a substrate in response to a control signal. The substrate transport controller is in operative communication with the substrate transport mechanism. The substrate characterization device is similar to the substrate characterization device described above. The substrate transport controller is configured to generate the control signal in response to the at least one characterization signal.

In other embodiments, a method for characterizing a substrate includes: positioning a substrate between at least one contact surface; contacting a side of the substrate; measuring a variance in at least two dimensions of capacitance of the substrate; generating a signal indicative of the measured variance; comparing the signal generated with at least one stored reference signal; and generating at least one characterization signal indicative of at least one characteristic of the substrate. In other embodiments, the method for characterizing a substrate further includes measuring a distance along the substrate. The method may performed by a xerographic printer or a handheld device.

In other embodiments, a substrate characterization device includes a sensor module, a memory module, and a processor. The sensor module includes a contact surface (e.g., located at an end of a probe) configured to make contact with a side of a substrate, for example, one side of a sheet of paper, positioned between the contact surface and a grounded conductive surface. In embodiments, a biasing member (e.g., a spring) is provided in close proximity to the probe for biasing the contact surface against the substrate.

The sensor module generates a signal due to the contact with the substrate. The processor is configured to execute a series of programmable instructions for comparing the signal generated by the sensor module with a reference signal stored by the memory module and generates at least one characterization signal. The at least one characterization signal is indicative of at least one characteristic of the substrate. In particular, the at least one characteristic is an electrical characteristic of the substrate.

In embodiments, a measuring module is in communication with the probe and includes means for measuring a distance along the substrate. The distance is measured via a line-scan by moving the probe along the substrate and/or by moving the substrate along the contact surface of the sensor module and the grounded conductive surface. The characteristic of the substrate may be the capacitance of the substrate and/or the dielectric thickness of the substrate.

DETAILED DESCRIPTION

Figure 1:
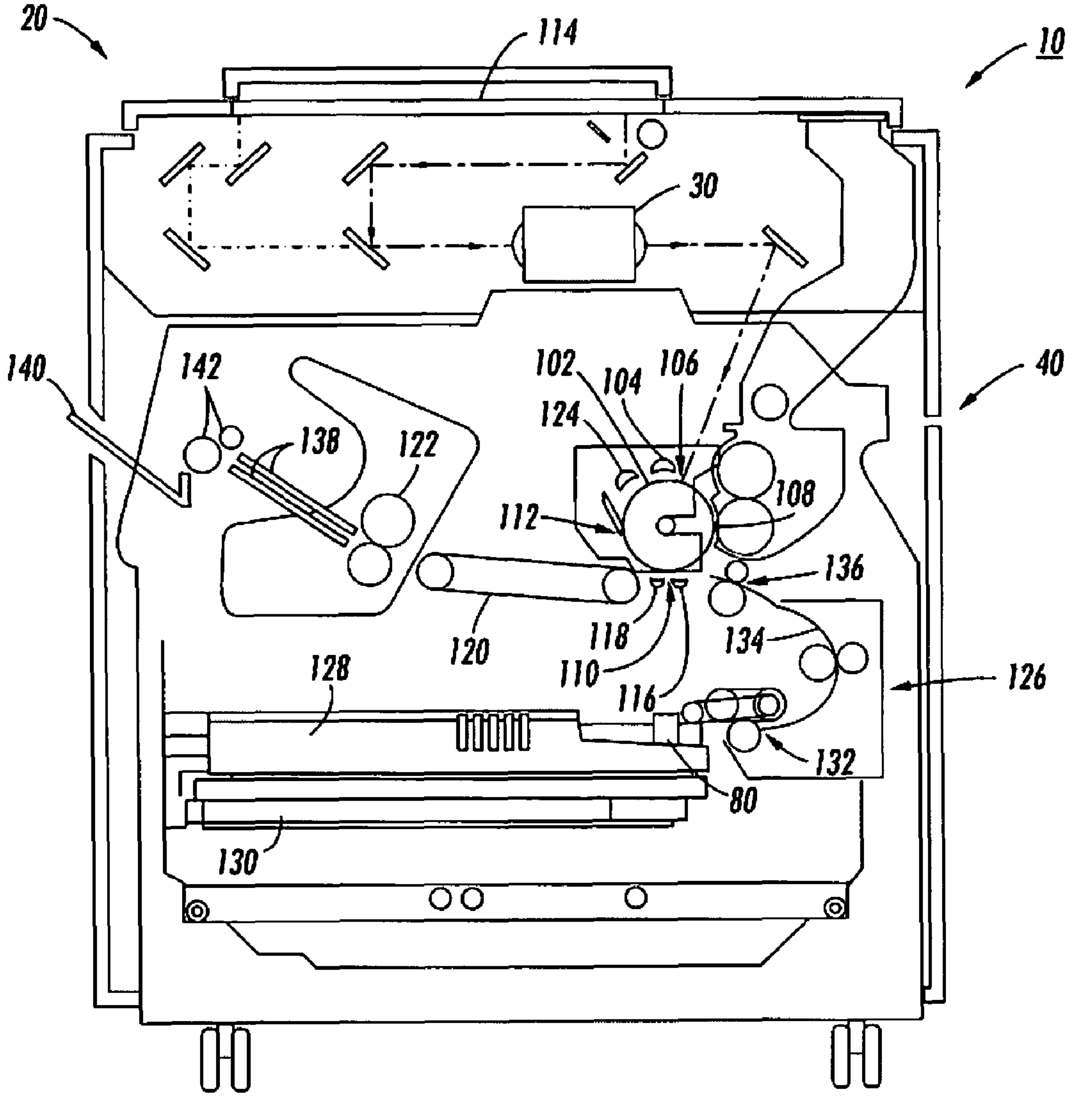
FIG. 1 shows a partial, side-elevational view of an exemplary networked electrophotographic machine incorporating a substrate characterization device according to an embodiment of the present disclosure.

Embodiments of the presently disclosed substrate characterization system and method will now be described in detail with reference to the drawings in which like reference numerals designate identical or corresponding elements in each of the several views.

Referring initially to FIG. 1, a partial, cutaway, side-elevational view of an exemplary multifunction electrostatographic machine 10 is shown. The machine 10 includes an image capture system 20, a controller 30, and a printing system 40. The printing system 40 includes a photoreceptor drum 102 mounted for rotation (as shown in FIG. 1) to carry a photoconductive imaging surface of the drum 102 sequentially through a series of processing stations. Namely, a charging station 104, an imaging station 106, a development station 108, a transfer station 110, and a cleaning station 112.

The general operation of the printing system 40 begins by depositing a uniform electrostatic charge on the photoreceptor drum 102 at the charging station 104 such as by using a corotron. An image of a document to be reproduced that is positioned on a platen 114 is obtained by the image capture system 20. In this embodiment, the image capture device within the image capture system 20 is a scanning device that produces a flowing light image that is directed to a controller 30. The controller 30 digitizes the flowing light image and/or passes the light image to the drum 102 at the imaging station 106 in the event that a physical copy of the document is to be made. The flowing light image selectively discharges the electrostatic charge on the photoreceptor drum 102 in the image of the document, whereby an electrostatic latent image of the document is laid down on the drum 102.

At the development station 108, the electrostatic latent image is developed into visible form by depositing toner particles on the charged areas of the photoreceptor drum 102. Cut sheets of a substrate are moved into the transfer station 110 in synchronous relation with the latent image on the drum 102 and the developed image is transferred to the substrate at the transfer station 110. A transfer corotron 116 provides an electric field to assist in the transfer of the toner particles to the substrate. The substrate is then stripped from the drum 102, the detachment being assisted by the electric field provided by an alternating current de-tack corotron 118. The substrate carrying the transferred toner image is then carried by a transport belt system 120 to a fusing station 122.

After transfer of the toner image from the drum 102, some toner particles usually remain on the drum 102. The remaining toner particles are removed at the cleaning station 112. After cleaning, any electrostatic charges remaining on the drum are removed by an alternating current erase corotron 124. The photoreceptor drum 102 is then ready to be charged again by the charging station 104, as the first step in the next copy cycle.

The transport of the substrate to the transfer station 110 in the above process is accomplished by a substrate supply system 126. In this embodiment, the substrate is selected from one of two types of substrate stored in two substrate trays, an upper, main tray 128 and a lower, auxiliary tray 130. The top sheet of substrate in the selected tray is brought, as required, into feeding engagement with a common, fixed position, sheet separator/feeder 132. The sheet separator/feeder 132 feeds a substrate around a curved guide 134 for registration at a registration point 136. Before the substrate is registered, the substrate is transported through, or by, a substrate characterization device 80, such that the substrate is characterized (discussed below). Once registered, the substrate is fed into contact with the drum 102 in synchronous relation to the toner image so as to receive the toner image on the drum 102 at the transfer station 110.

The substrate carrying the transferred toner image is transported, by the transport belt system 120, to the fusing station 122, which is a heated roll fuser. The heat and pressure in the nip region between the two rolls of the fuser cause the toner particles to melt and some of the toner is forced into the fibers or pores of the substrate. The substrate with the fused image which is a copy of the document is then fed by the rolls in the fusing station 122 along output guides 138 into a catch tray 140 via the output roll pair 142.

Figure 2A:
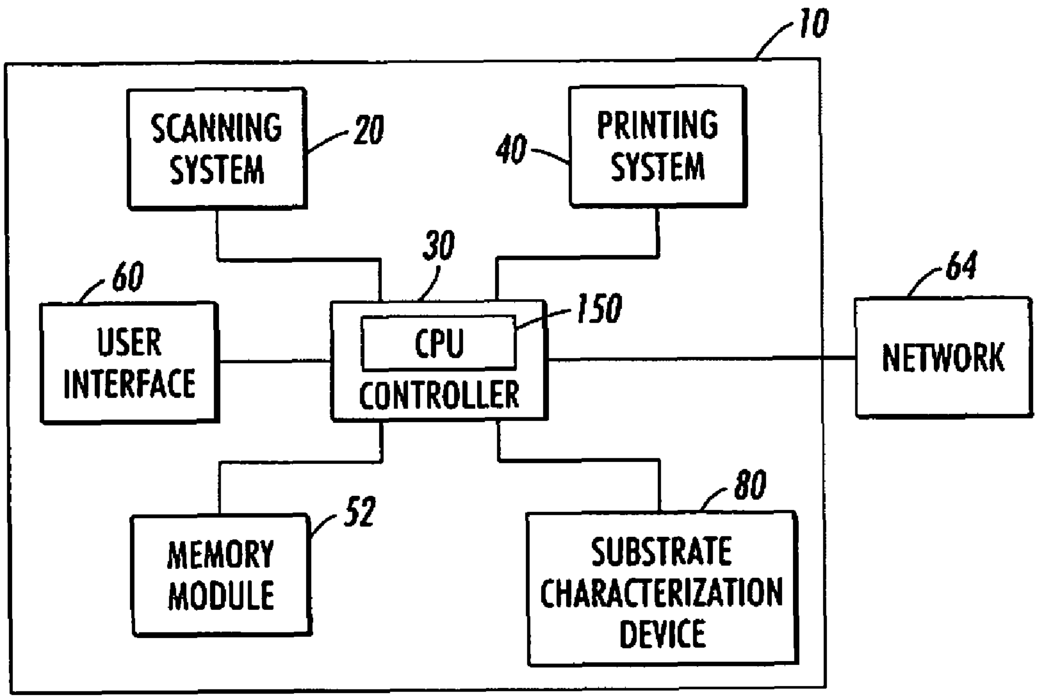
FIG. 2A shows a schematic representation of a digital processing station having a substrate characterization device within the electrophotographic machine of FIG. 1.

Operation of the machine 10 is controlled by the controller 30 shown in FIG. 2A. The controller 30 includes a CPU or processor 150 and communicates with a memory module 52. The memory module 52 may comprise RAM, ROM, CD-ROM, or other media of storage such as hard disk, magnetic tape, or the like. Other devices for accepting, capturing and storing data are well known and the above list should not be construed as exhaustive.

The memory module 52 may contain stored document files 54 and system software 56. The system software 56 which is run by the processor 50 may reside in ROM, RAM, or other units of storage. It will also be appreciated that the memory 52 may be a shared or distributed resource among many processors in a networked configuration.

The controller 30 is connected to the image capture system 20, the printing system 40, a user interface 60, a substrate characterization device 80 and a network 64. The image capture device in this embodiment is a scanning device; however, other image capture devices may be used including, but not limited to, charge coupling devices. The user interface 60 is generically labeled and encompasses a wide variety of such devices. These interface devices include touch screens, keyboards, and graphic user interfaces.

In embodiments, the substrate characterization device 80 (FIGS. 2A, 2B and 3) may be placed in the printing device to directly characterize a substrate as it enters or is fed into the machine 10, for example, but not limited to, at a location placed directly next to the upper, main tray 128. In another embodiment, the substrate characterization device 80, as described above, can be placed just before or just after the upper, main tray 128 and/or the lower, auxiliary tray 130. However, the substrate characterization device 80 can render characterizations of substrate at any location of the printing machine 10.

In embodiments, as shown by example in FIG. 2A, the substrate characterization device 80 can provide feedback to the processor 50 for taking action in response to critical substrate measurements, such as capacitance measurements and dielectric thickness measurements of a substrate. Additionally, there may be provided any number of substrate characterization devices placed anywhere in the printer as needed, not only in the locations illustrated or discussed.

The information gathered therefrom is used by the processor 50 and/or any other processor/controller within the printing machine, in various ways (e.g. executing a series of programmable instructions) to aid in the operation of the printer, whether in a real-time feedback loop, an offline calibration process, a registration system, etc. While the substrate characterization device 80 and the processor 50 are shown in the figures as being separate elements, it can be appreciated that in other embodiments, the substrate characterization device 80 may be a part of the processor 50.

In embodiments, the substrate characterization device 80 is configured to measure different kinds and amounts of substrate, for example, substrate batches. The substrate characterization device may also rank and/or characterize different batches of substrate for image quality (IQ) performance. A so-called "high quality" substrate batch could be saved for the highest IQ jobs, where a so-called "lower quality" batch could be used for average IQ jobs. IQ performance may be, for example, but is not limited to, clarity, resolution, sharpness, and transparency.

In general, a substrate characterization device 80 is based on the uniformity of the substrate dielectric thickness or capacitance, as measured by a small scanning probe of about, but not limited to, 1.5 mm in diameter.

Figure 4:
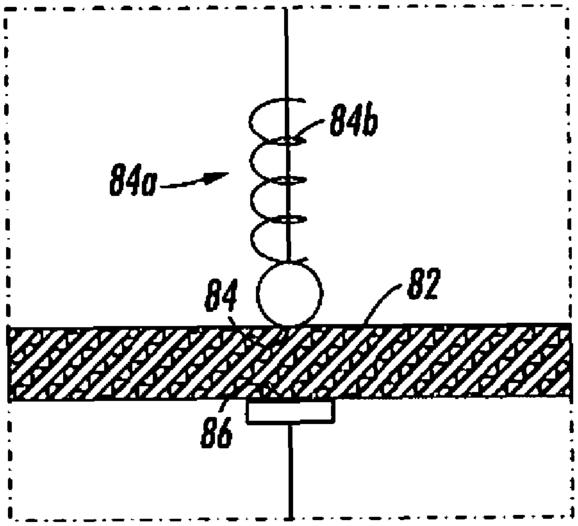
FIG. 4 shows a side-elevational view of an exemplary representation of a first and second contact surface of the sensor module of FIG. 3.

In use, substrate 82 is scanned between a first contact surface 84 and second contact surface 86. In embodiments, substrate 82 may be for example, but not limited to, a sheet of paper, glossy paper, recycled paper or any other kind of substrate known in the art, including non-paper substrates such as metallic substrates. The first contact surface 84 is located at the end of a probe 84*a*, where the substrate and the first contact surface contact each other. The second contact surface 86 may be, for example, a grounded conductive surface. In embodiments, the probe 84*a* is self-spaced and biased against the substrate by a biasing member 84*b*, which may be for example, but not limited to, a spring (as shown in FIG. 4). The substrate 82 and the first and second contact surfaces 84 and 86 are in bidirectional communication. In this manner, the substrate 82 can be line-scanned between the first contact surface 84 and the second contact surface 86 in any direction depicted by bidirectional arrow 88, thus allowing the substrate characterization device to be placed in any location of a printer and/or sheet handling device.

Additionally or alternatively, the first and second contact surfaces 84 and 86 can be line-scanned on the substrate (i.e. ran over the substrate), in any direction depicted by bidirectional arrow 88, which enables the substrate characterization device to be used in a portable or handheld fashion. In this manner, the substrate characterization device characterizes the substrate and yields a substrate IQ performance at any location convenient to a user.

Figure 2B:
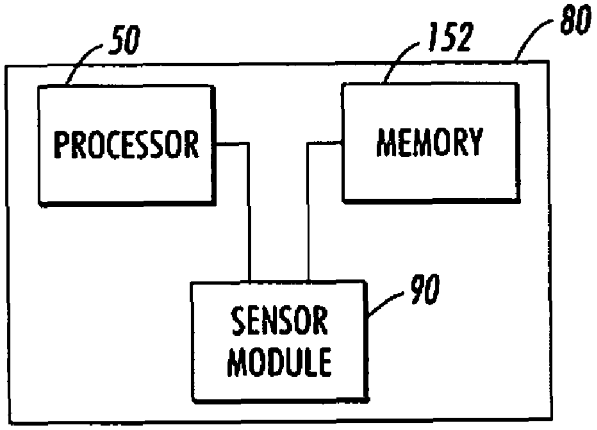
FIG. 2B shows a schematic representation of an exemplary embodiment of the components of the substrate characterization device of FIG. 2A.
Figure 3:
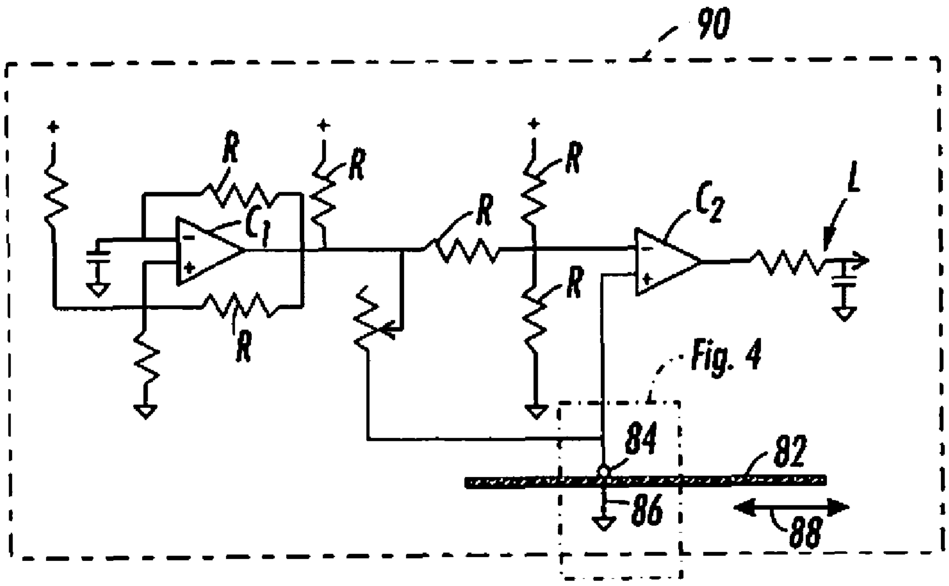
FIG. 3 shows an exemplary circuit diagram within a sensor module of the substrate characterization device of FIG. 2B.

Referring now to FIG. 3, a sensor module 90 of substrate characterization device 80 (shown in FIGS. 2A and 2B) is illustrated having electronic circuitry. In an exemplary embodiment, the sensor module 90 may include a single integrated circuit (IC). The sensor module 90 includes a processor 50 (shown in FIG. 2B) which is in operative communication with a first comparator $C_1$.

The first comparator $C_1$ (e.g., an operational amplifier) is adapted to receive a processing signal (e.g., a voltage) from the processor 50, which in turn, is received by one of the inputs of a first comparator $C_1$. The first comparator $C_1$ then generates a periodic signal (e.g., a square wave), which may be for example, but not limited to, about 400 KHz. The periodic signal is then fed through at least one resistor, labeled R, which in turn, leads to a second comparator $C_2$ (e.g., an operational amplifier).

The second comparator $C_2$ is in operative communication with the first contacting surface 84 and a second contacting surface 86. In this configuration, a capacitance bridge circuit is created, such that the capacitance changes between the first contact surface 84 and the second contact surface 86, as the substrate 82 is moved along the first and second contact surfaces 84 and 86. Additionally or alternatively, the capacitance may change as the first and second contact surfaces 84 and 86 is moved along the substrate 82. The change in capacitance is depicted in various forms, for example, but not limited to, varying length pulses, which exit from the output of the second comparator $C_2$.

The varying length pulses, which may be for example, but not limited to, pulse wave modulated (PWM) pulses, are then filtered, for example, by a low-pass filter into a resulting amplitude signal. As a result, the resulting amplitude signal may be a measure of the substrate capacitance received from the first and second contact surfaces 84 and 86. As the substrate is line-scanned by the first and second contact surfaces 84 and 86, the resulting capacitance signal is captured.

The capacitance signal is then analyzed by a analysis module (e.g., a processor 50), which characterizes the substrate 82 by comparing the resulting capacitance signal to a reference signal stored in a memory module 152 (as shown in FIG. 2B). The reference signal may be a real-time reference signal or a predetermined reference signal (e.g., look-up table and stored values).

In embodiments, the substrate characterization device 80 also includes a measuring module (not shown), which is in operative communication with the probe 84*a* and is configured to measure a distance along the substrate 82. The distance may be measured via a line-scan by moving the first and second contact surfaces 84 and 86 along the substrate 82, or, additionally or alternatively, the distance may be measured by moving the substrate 82 along the first and second contact surfaces 84 and 86.

Example

Figure 5A:
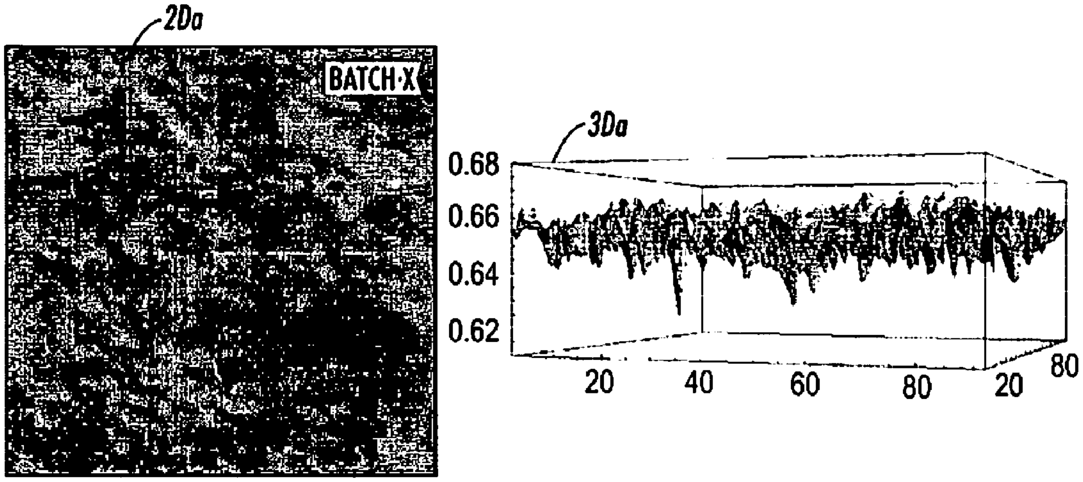
FIGS. 5A and 5B show graphical representation images of capacitance variation, according to an embodiment of the present disclosure.
Figure 5B:
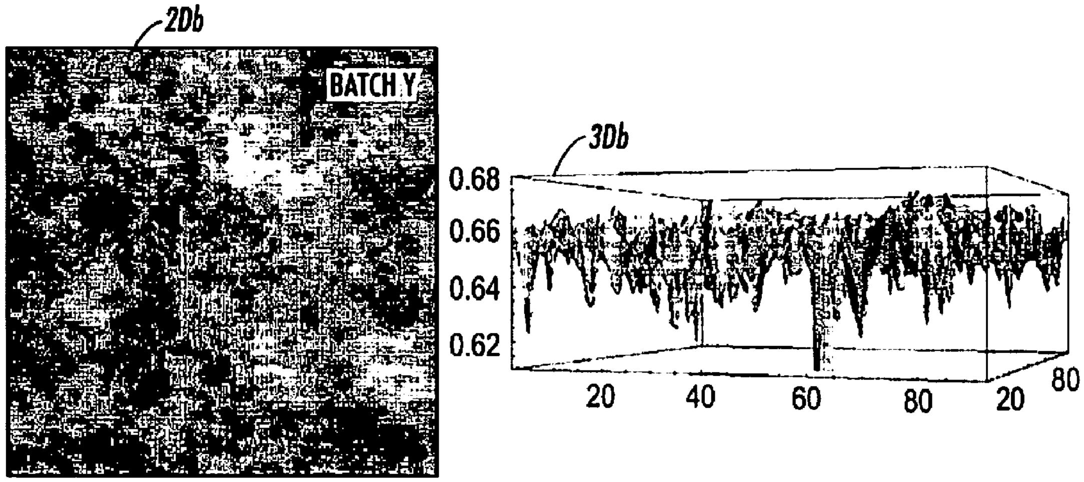

In an example, an experiment was conducted where the capacitance of a substrate, for example, a sheet of paper, was found to correlate with image mottle of a resulting print job, as shown in FIGS. 5A and 5B. Two batches of substrate were selected, namely, Xerox Digital Color Elite Gloss Paper, and labeled Batch X and Batch Y. In various tests, results showed consistent differences between the two different kinds of batches of the substrate, namely, Batch X and Batch Y. A substrate characterization device, according to the present disclosure, was used to perform two-dimensional electrical line-scans which utilized a sensor module having a circuitry, similar to the one described above. The two-dimensional electrical line-scans were obtained and analyzed, resulting the electrical variations at image mottle frequencies of about 1 mm/cycle to about 5 mm/cycle. The spatial resolution was about 0.5 mm and the sample size (i.e., scanned area) was about 5 cm by about 5 cm. The images 2Da, 3Da, 2Db, and 3Db, shown in FIGS. 5A and 5B, illustrate the variation or "mottle" of the capacitance detected.

Images 2Da and 2Db are two-dimensional images where the density of the image represents the variation of the capacitance, whereas images 3Da and 3Db show a waterfall style plot of the same data. In images 2Da and 2Db, the magnitude of the variation of the capacitance is represented by the contrast of the image, while in images 3Da and 3Db (i.e., three dimensional graph) the variation is depicted by the vertical range of the signals. Batch X, as shown in FIG. 5A, showed less capacitance variation than Batch Y, as shown in FIG. 5B. By utilizing quantitative analysis, such as, applying a band-pass filter around the mottle frequencies to the electrical line-scans, the root mean square (RMS) was calculated and variation of the filtered image was found. The results are shown below in Table (1).

TABLE (1)

| | Batch X | Batch Y |
|---|---|---|
| Two-Dimensional Scan (5 × 5 $cm^2$) | 5.81 | 2.66 |
| Line-scan (5 cm) | 4.74 | 2.79 |
| Image mottle (NMF) | 38.1 | 34.6 |
| Line-scan error (RMS at 5 cm) | 0.59 | 0.37 |
| Line-scan error (RMS at 20 cm) | 0.29 | 0.18 |

Referring to Table (1) above, line-scan data and two-dimensional results are shown, which illustrate a correlation between the image mottle and the electrical line-scans. In addition, the line-scan captured the magnitude of the full two-dimensional variations. When more statistical analysis was conducted, it was found that a single line-scan of about 5 cm had significant error, as shown in Table (1). Whereas, when the line-scan was extended to the width of a letter size page (e.g., about 20 cm or about 8.5 inches), the error was reduced significantly, as shown in Table (1). To further improve the signal-to-noise ratio, multiple probes can be implemented to scan the substrate simultaneously. To sample a greater area of the substrate, the probes should be placed with separations greater than 2 mm in the direction that is perpendicular to the substrate motion.

The substrate characterization device, in accordance to the present disclosure, was capable of characterizing the quality of every sheet of substrate by a single pass of single or multiple line-scans. Thus, a sensor module, as described above, can be implemented as an inline device (e.g., in a printing device or a sheet handling device), along the substrate path before transfer, the substrate characteristics can be operably communicated to a processor for IQ adjustments or other programmable instructions. In embodiments, "low quality" substrates may be rejected and stored in a separate bin for low IQ print jobs and/or "high quality" substrates may be stored in a separate bin for high IQ print jobs.

In other embodiments, the substrate characterization device, in accordance to the present disclosure, may be used by a service technician to determine if a customer's substrate is the root cause of a printer malfunction, for example, an IQ problem. In embodiments, the substrate characterization device, in accordance to the present disclosure, can be in the form of a handheld device, where a service technician can carry the handheld substrate characterization device and perform a line-scan to determine whether the substrate and/or the batch of substrate is the cause of a printing IQ problem.

In other embodiments, a substrate characterization device, in accordance to the present disclosure, may be used as a substrate inspection tool for incoming substrate qualification. In addition, the substrate characterization device can be configured to be coupled to a substrate manufacturing process. A substrate manufacturing device is generally known in the art. The process of making substrate will not be discussed, since the present embodiment can be operably coupled to any substrate manufacturing device.

The substrate characterization device may be operably coupled during the process of manufacturing substrate, such that, the capacitance of at least one sheet of substrate being produced by the manufacturing device may be measured at any stage of the substrate manufacturing process. In an embodiment, a substrate transport mechanism can configured to transport a sheet of substrate, in response to a control signal. The substrate transport mechanism may include a substrate transport controller which may be in operative communication with the substrate transport mechanism and include a substrate characterization device for determining the quality of a substrate, which may include, measuring the capacitance.

Figure 6:
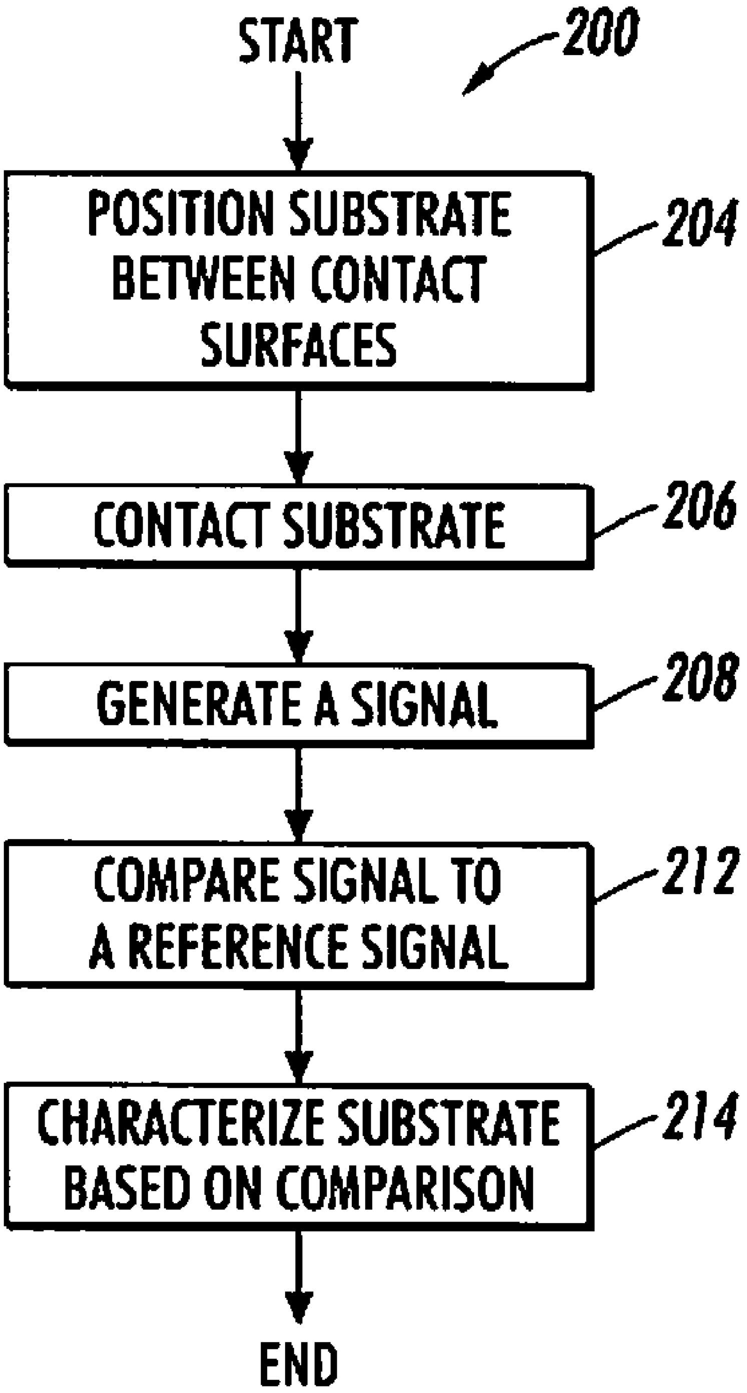
FIG. 6 shows a flow chart of a method for characterizing a substrate in accordance with an embodiment of the present disclosure.

In accordance with the present disclosure, a method for characterizing a substrate is disclosed. The method for characterizing a substrate, as shown in FIG. 6, is generally depicted as reference numeral 200. In an initial step 202, a substrate, for example, but not limited to, a sheet of paper is provided to a substrate characterization device 80, as discussed above. In step 204, a substrate is positioned between a first contact surface 84 and a second contact surface 86, such that, each contact surface 84 and 86 is positioned opposite from each other.

In step 206, each contact surface is line-scanned and/or contacts a respective side of the substrate that is positioned between the first and second contact surfaces. In step 208, a signal is generated from the resulting contact. In step 210, at least one reference signal is stored in a memory module 152 (as shown in FIG. 2B).

In step 212, the generated signal is compared the reference signal and in step 214, the substrate is characterized based on the comparison of the generated signal and the reference signal. Thus resulting in step 216, where at least one characteristic is determined based on the comparison. In other embodiments, an additional step 218 is executed by the processor 50 in accordance with the determined characteristic of the substrate. As discussed above, "high quality" substrates may be stored for high IQ print jobs, and "low quality" substrates may be stored for low IQ print jobs. In addition, a so-called "high quality" substrate batch is characterized for the highest IQ jobs, where a so-called "lower quality" batch is characterized for average IQ jobs. IQ performance may be, for example, but is not limited to, clarity, resolution, sharpness, and transparency.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A substrate characterization device comprising:

a sensor module having at least one contact surface configured to contact said substrate, said sensor module configured to measure a variance of capacitance in at least two dimensions of said substrate, said sensor module further configured to generate a signal indicative of said measured variance;

a processor in operative communication with a memory module and configured to execute a series of programmable instructions for making a comparison of said signal generated by said sensor module with at least one reference signal, said processor further configured to generate at least one characterization signal based on said comparison, wherein said at least one characterization signal is indicative of at least one characteristic of said substrate;

wherein said at least one contact surface is located at an end of a probe; and a measuring module in communication with said probe and configured to measure a distance along said substrate.

2. The substrate characterization device according to claim 1, wherein said at least one reference signal is stored by said memory module.

3. The substrate characterization device according to claim 1, wherein said at least one reference signal is a real-time reference signal.

4. The substrate characterization device according to claim 1, wherein said at least one characteristic is selected from the group consisting of clarity, resolution, sharpness, and transparency.

5. The substrate characterization device according to claim 1, wherein said distance is measured via a line-scan by moving said probe along said substrate.

6. The substrate characterization device according to claim 1, wherein said distance is measured by moving said substrate along a plurality of contact surfaces.

7. The substrate characterization device according to claim 1, further comprising a spring in proximity to said probe for biasing said at least one contact surface of said probe against said substrate.

8. The substrate characterization device according to claim 1, wherein said at least one characteristic of said substrate is based on a quality of said substrate.

9. The substrate characterization device according to claim 1, wherein said substrate is paper.

10. The substrate characterization device according to claim 1, wherein said substrate characterization device is integrated within a xerographic printer.

11. The substrate characterization device according to claim 1, wherein said substrate characterization device is a handheld device.

12. The substrate characterization device according to claim 1, wherein said sensor module comprises at least one comparator, at least one resistor, and at least one capacitor.

13. A substrate handling device comprising:

a substrate transport mechanism configured to transport a substrate in response to a control signal;

a substrate transport controller in operative communication with said substrate transport mechanism; and a substrate characterization device including:

a sensor module having at least one contact surface configured to contact said substrate, said sensor module configured to measure a variance of capacitance in at least two dimensions of said substrate, said sensor module further configured to generate a signal indicative of said measured variance; and a processor in operative communication with a memory module and configured to execute a series of programmable instructions for making a comparison of said signal generated by said sensor module with at least one reference signal, said processor further configured to generate at least one characterization signal based on said comparison, wherein said at least one characterization signal is indicative of at least one characteristic of said substrate, wherein said substrate transport controller is configured to generate said control signal in response to said at least one characterization signal.

14. The substrate handling device according to claim 13, wherein said substrate is paper.

15. The substrate characterization device according to claim 13, wherein said at least one characteristic of said substrate is based on a quality of said substrate.

16. The substrate handling device according to claim 13, wherein said contact surface is located at an end of a probe.

17. The substrate handling device according to claim 16, further comprising a measuring module in communication with said probe and comprising means for measuring a distance along said substrate.

18. A substrate characterization device comprising:

a sensor module in operative communication with a signal source, said sensor module having a first contact surface and a second contact surface positioned opposite from each other, wherein each contact surface makes contact with a respective side of a substrate positioned between said first and second contact surfaces, said sensor module configured to measure a variance of capacitance in at least two dimensions of said substrate, said sensor module further configured to generate a signal indicative of said measured variance;

a memory module storing at least one reference signal; and a processor in operative communication with said memory module and configured for executing a series of programmable instructions for comparing said signal generated by said sensor module with said at least one reference signal and generating at least one characterization signal based on said comparison, said at least one characterization signal indicative of at least one characteristic of said substrate;

wherein said substrate characterization device is integrated within a xerographic printer.

19. The substrate characterization device according to claim 18, wherein said substrate is paper.

20. The substrate characterization device according to claim 18, wherein said substrate characterization device is a handheld device.

21. The substrate characterization device according to claim 18, wherein said at least one characteristic is selected from the group consisting of clarity, resolution, sharpness, and transparency.

* * * * *